(12) United States Patent
Lee

(10) Patent No.: US 7,379,021 B2
(45) Date of Patent: May 27, 2008

(54) CIRCUIT BOARD

(75) Inventor: Chang-Jung Lee, Longtan Township, Taoyuan Country (TW)

(73) Assignee: Arcadyan Technology Corporation, Hsinchu (TW)

( * ) Notice: Subject to any disclaimer, the term of this patent is extended or adjusted under 35 U.S.C. 154(b) by 0 days.

(21) Appl. No.: 11/262,909

(22) Filed: Nov. 1, 2005

(65) Prior Publication Data

US 2007/0096995 A1    May 3, 2007

(51) Int. Cl.
*H01Q 1/38*      (2006.01)
*H01R 12/00*    (2006.01)

(52) U.S. Cl. .............................. 343/700 MS; 343/906; 439/55; 439/59; 439/62; 439/65; 439/79

(58) Field of Classification Search ......... 343/700 MS, 343/906; 24/324, 572.1, 584.1, 592.1; 439/176, 439/564, 573, 577, 55, 59, 62, 65, 78, 79; 29/739
See application file for complete search history.

(56) References Cited

U.S. PATENT DOCUMENTS

| | | | |
|---|---|---|---|
| 6,239,765 B1 * | 5/2001 | Johnson et al. | 343/795 |
| 6,426,724 B2 * | 7/2002 | Gunee et al. | 343/702 |
| 6,741,460 B2 * | 5/2004 | Huang | 361/683 |
| 6,894,651 B2 * | 5/2005 | Yokochi et al. | 343/702 |

FOREIGN PATENT DOCUMENTS

TW           565018      1/2003

* cited by examiner

*Primary Examiner*—Hoang V Nguyen
*Assistant Examiner*—Robert Karacsony
(74) *Attorney, Agent, or Firm*—Birch, Stewart, Kolasch & Birch, LLP

(57) ABSTRACT

A circuit board includes an antenna substrate and a main substrate. The antenna substrate has at least one first linking portion. The main substrate has at least one second linking portion. The first linking portion connects with the second portion so that the antenna substrate assembles with the main substrate. Herein, the antenna is substantially perpendicular to the main substrate.

18 Claims, 6 Drawing Sheets

CIRCUIT BOARD

BACKGROUND OF THE INVENTION

1. Field of Invention

The invention relates to a circuit board and, in particular, to a circuit board with an antenna layout.

2. Related Art

Due to the progress of the wireless communication techniques, wireless communication devices are widely spread and become the mainstream of modern products such as the wireless network cards, personal digital assistants, mobile phones, Bluetooth earphones, etc. In the wireless communication devices, the antenna is an important element used for receiving and emitting wireless signals. Generally speaking, the conventional wireless communication devices are usually equipped with a circuit board, which is installed with an antenna and a circuit layout for processing signals. The antenna is used to receive and emit wireless signals. The signal processing circuit processes (modulates or demodulates) the wireless signals.

Since the antenna and the signal processing circuit are both formed on the above-mentioned circuit board, they are likely to interfere with each other, resulting in antenna characteristic shifts or efficiency lowering. Therefore, the antenna has to be tested (e.g. its polarization properties) once the entire circuit board is finished. Then, the antenna has to be modified according to the test results. For example, the dimension of the antenna might be changed, which is very inconvenient.

Moreover, as the antenna is disposed on the circuit board, its characteristics are thus restricted by the material of the circuit board. In view of the requirement of more compact wireless communication products, the volume of the circuit board is also shrinking. The space allocated for the antenna and the signal processing circuit is also limited. Accordingly, elements in the signal processing circuit may have serious interference with the antenna, causing low transmission efficiency of the circuit board. For example, if the height of a capacitor is far taller than the antenna, the transmitted data may be distorted.

Therefore, it is an important subject of the invention to provide a better circuit board design to avoid the above-mentioned problems.

SUMMARY OF THE INVENTION

In view of the foregoing, the invention is to provide a circuit board that is convenient in modifying the antenna design.

In addition, the invention is to provide a circuit board that can effectively reduce the antenna layout.

Moreover, the invention is to provide a circuit board that can avoid interference from other electronic elements.

To achieve the above, a circuit board of the invention includes an antenna substrate and a main substrate. The antenna substrate has at least one first linking portion, and the main substrate has at least one second linking portion. The first linking portion connects to the second linking portion, so that the antenna substrate and the main substrate are assembled. The antenna substrate is substantially perpendicular to the main substrate.

As mentioned above, the circuit board of the invention has independent antenna substrate and main substrate. With the connection of the first linking portion and the second linking portion, the antenna substrate and the main substrate are assembled in a substantially vertical configuration. Therefore, when the antenna needs to be modified or replaced, the manufacturer only needs to separate the antenna substrate from the main substrate, and then assembles a desired antenna substrate with the main substrate. In this case, the antenna design can be readily modified, and the designs for the antenna substrate and the main substrate become more flexible. Moreover, the antenna layout is not directly disposed on the main substrate. Therefore, the area occupied by the antenna layout is largely reduced, which can efficiently minimize the product volume. In addition, since the antenna substrate and the main substrate are substantially perpendicular to each other, the height of the antenna can be increased to avoid interference with other electronic devices.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
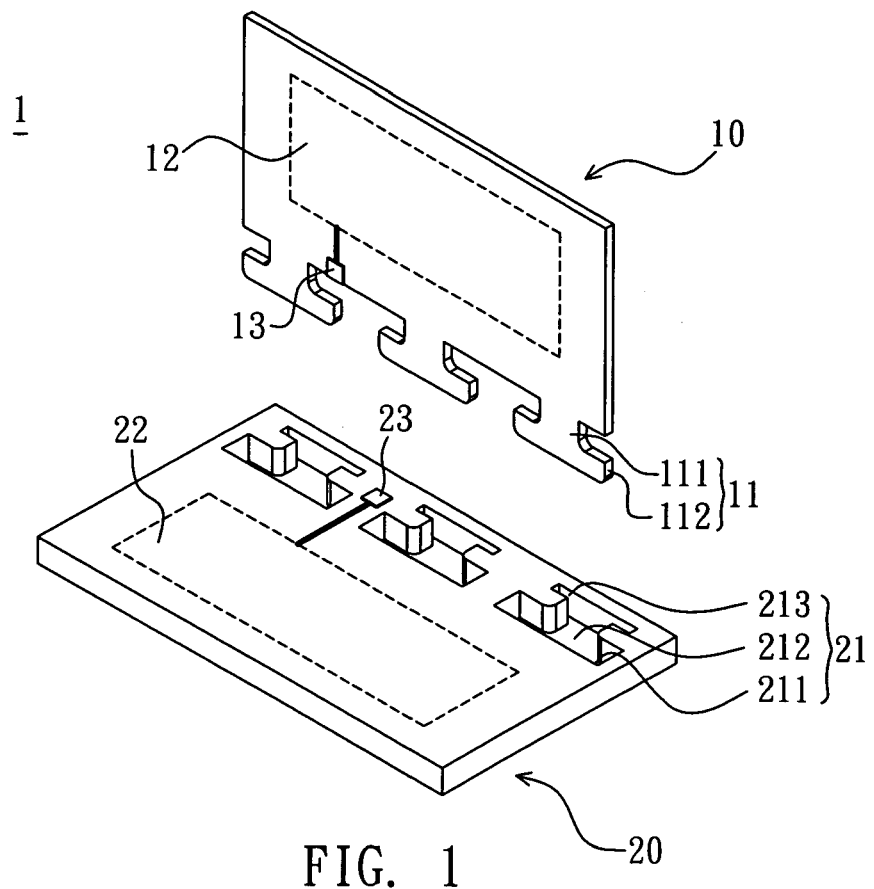
FIG. 1 is a schematic view of a circuit board according to a preferred embodiment of the invention.

With reference to FIG. 1, the circuit board 1 according to a preferred embodiment of the invention includes an antenna substrate 10 and a main substrate 20.

In this embodiment, the antenna substrate 10 has three first linking portions 11, an antenna unit 12 and a first signal terminal 13. It should be noted that even though the number of the first linking portion 11 in this embodiment is three, it is not limited by this example and can be adjusted according to needs. Herein, the antenna substrate 10 can be made of bismaleimide-triazine (BT) resins, FR4 BT epoxy, or ceramics. The antenna unit 12 is embedded in one surface of the antenna substrate 10 to receive and emit wireless signals. The first signal terminal 13 is electrically coupled to the antenna unit 12 for signal transmissions. In this embodiment, each first linking portion 11 is a T-shaped protruding portion and has a neck part 111 and an end part 112.

The main substrate 20 has three second linking portions 21, a signal processing circuit 22, and a second signal terminal 23. The signal processing circuit 22 is embedded in one surface of the main substrate 20, and is electrically coupled to the second signal terminal 23. The second signal terminal 23 is disposed at a position corresponding to the position of the first signal terminal 13.

After the antenna substrate 10 and the main substrate 20 are assembled, the first signal terminal 13 and the second signal terminal 23 are in contact with each other for the antenna unit 12 and the signal processing circuit 22 to exchange signals. To be noted, even though the number of the second linking portions 21 is three in this embodiment, the invention is not limited by this example and the number can be adjusted according to needs.

In the current embodiment, the second linking portion 21 is an H-shaped hole with an insertion part 211, a channel 212, and an engaging part 213. The shapes and dimensions of the insertion part 211, the channel 212, and the engaging part 213 are designed in accordance with those of the neck part 111 and the end part 112 of the first linking portion 11.

In this embodiment, the shape and dimension of the insertion pail 211 are just right for the end part 112 to go through. The shape and dimension of the channel 212 is just right for the neck part 111 to go through. The dimension of the connecting part 213 is smaller than that of the end part 112. The thickness of the main substrate 20 is about the same as the height of the neck part 111 for the convenience of connections between the antenna substrate 10 and the main substrate 20.

Figure 2:
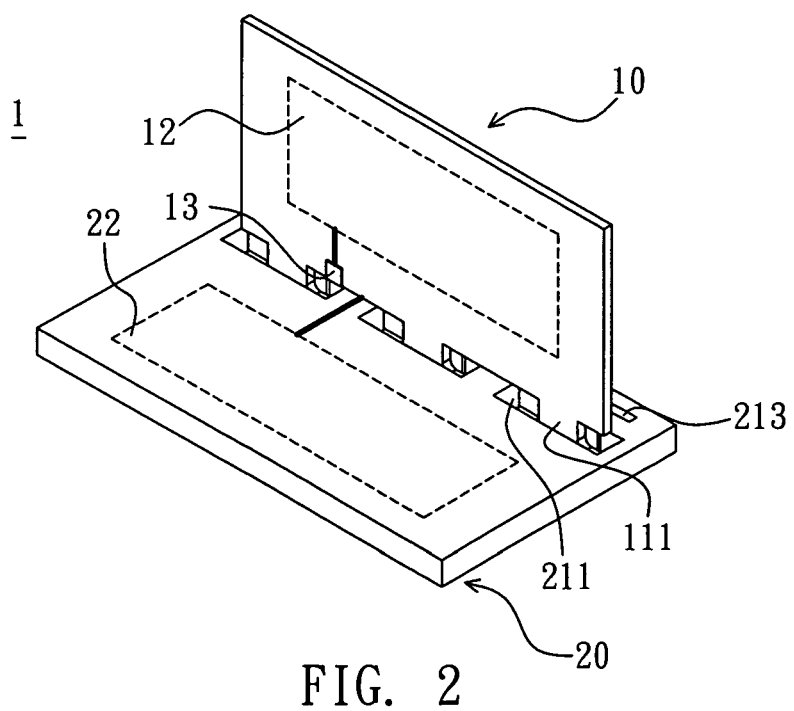
FIGS. 2, 3, 4, and 5 are schematic views showing the assembling procedures of the circuit board according to the embodiment of the invention.
Figure 3:
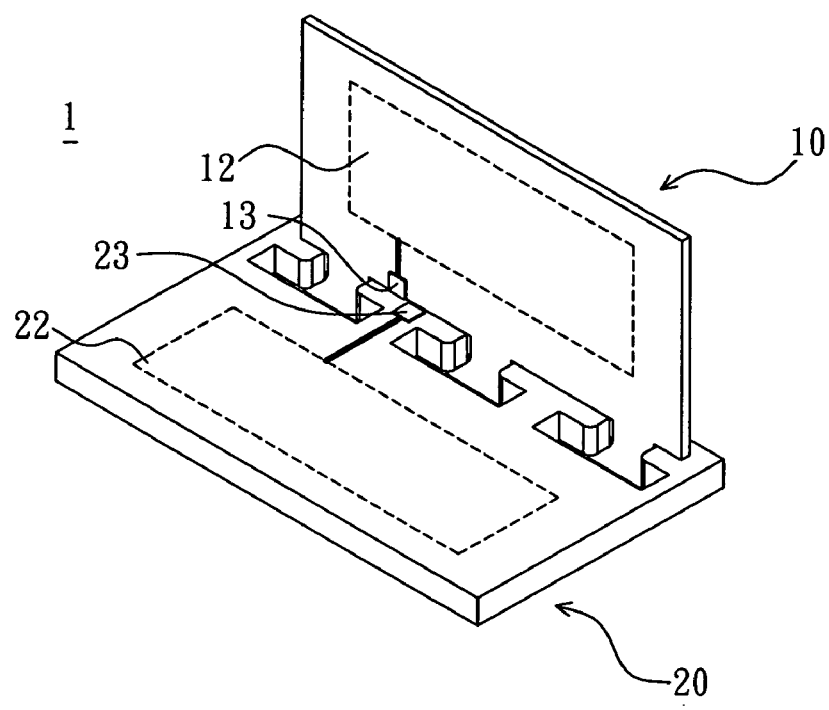
Figure 4:
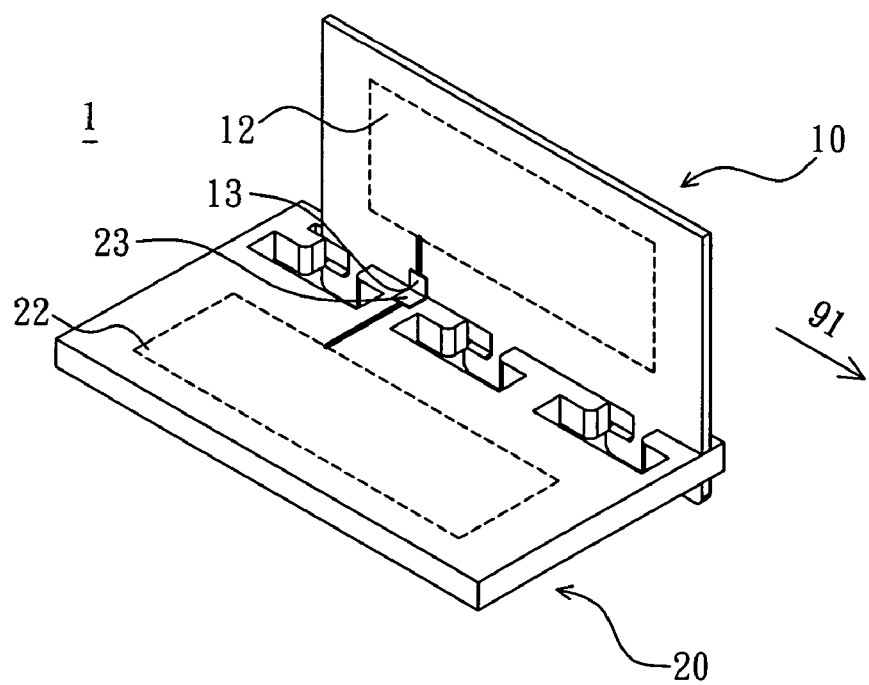
Figure 5:
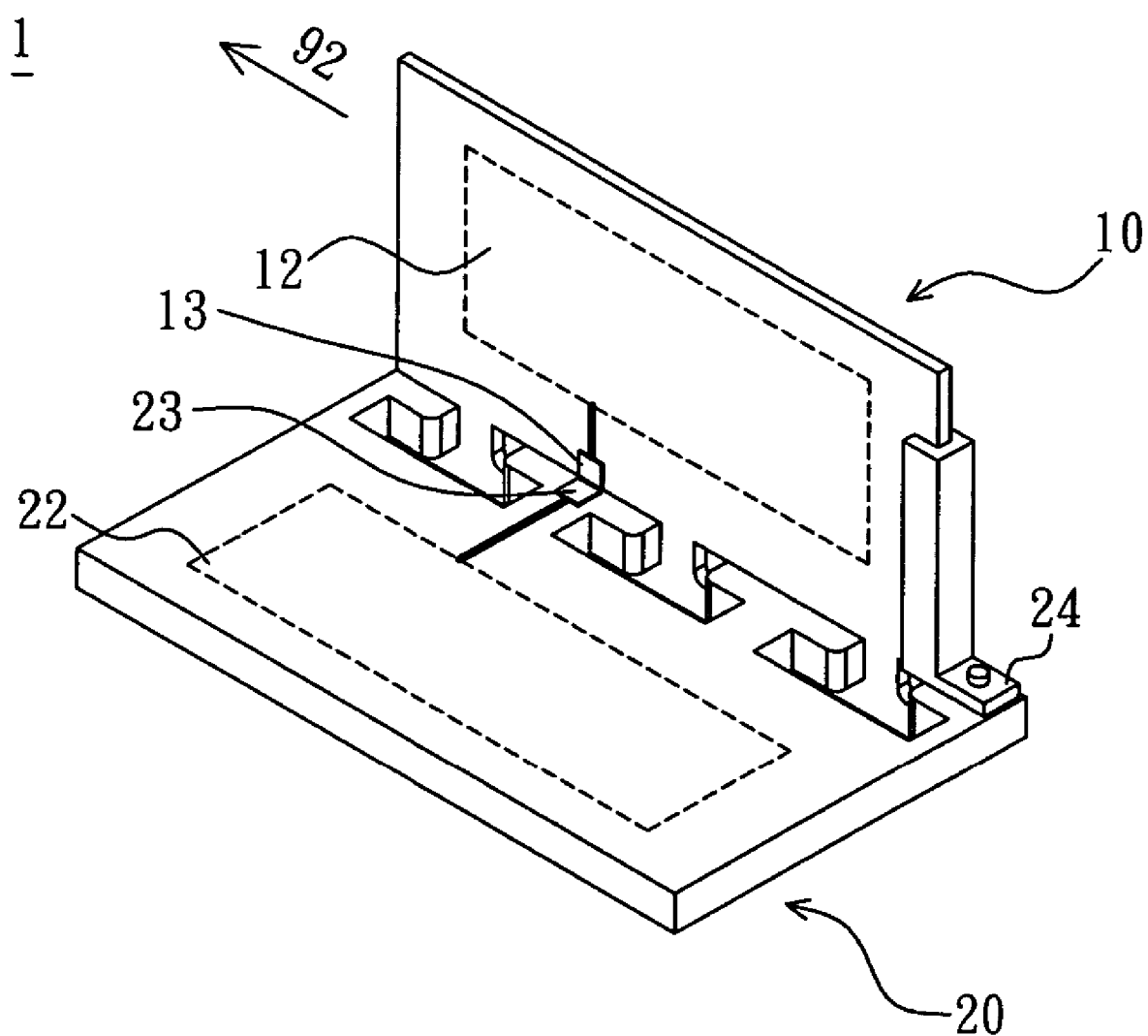

FIGS. 2, 3, 4, and 5 schematically illustrate the assembling procedures of the circuit board of the invention. To assemble the antenna substrate 10 and the main substrate 20, the first linking portions 11 of the antenna substrate 10 is firstly inserted into the insertion part 211 of the second linking portions 21 on the main substrate 20 (FIG. 2). Afterwards, the neck part 111 goes through the channel 212 and reaches the engaging part 213 (FIG. 3). In this case, the antenna substrate 10 has a relative displacement with respect to the main substrate 20 along a first direction 91. Since the thickness of the main substrate 20 is roughly equal to the height of the neck part 111 and the size of the engaging part 213 is smaller than that of the end part 112, it is thus possible for the neck part 111 and the end part 112 to be fixed inside the engaging part 213. This further prevents the first linking portions 11 and the second linking portions 21 from loosening (FIG. 4). Besides, the antenna substrate 10 of the embodiment has but is not limited to have a relative displacement with respect to the main substrate 20 along the first direction 91. Alternatively, the antenna substrate 10 may have a relative displacement with respect to the main substrate 20 along a second direction 92 (as shown in FIG. 5). In this manner, the antenna substrate 10 and the main substrate 20 can be successfully assembled. Furthermore, a fixing element 24 can be provided for facilitating to fasten the antenna substrate 10 on the main substrate 20. As shown in FIG. 5, the fixing element 24 is disposed adjacent to the antenna substrate 10 and is screwed on the main substrate 20. Thus, the antenna substrate 10 can be prevented from detaching from the main substrate 20. In practice, the fixing element 24 may further insert into a part of the insertion part 211 so as to strengthen the structure. Besides, the fixing element 24 can be fixed on the main board 20 by way of adhering, welding, or other suitable method.

As described above, the first linking portions 11 and the second linking portions 21 are engaged with each other so as to assemble the antenna substrate 10 and the main substrate 20. In this embodiment, the antenna substrate 10 is essentially perpendicular to the main substrate 20, so that the space use of the antenna unit 12 and the signal processing circuit 22 is more flexible to avoid possible interference. Thus, there will be no characteristic shifts or efficiency reduction in the antenna unit 12.

Moreover, the antenna unit 12 and the signal processing unit 22 are disposed on the antenna substrate 10 and the main substrate 20, respectively. Therefore, they can be tested independently before the assembling procedures. In comparison with the prior art, the circuit board 1 has the advantages of being convenient in testing and design modification. Besides, the manufacturer may select an appropriate substrate for the antenna substrate 10 to obtain a higher efficiency for the antenna unit 12.

After the antenna substrate 10 and the main substrate 20 are assembled, the first signal terminal 13 and the second signal terminal 23 are electrically coupled for the antenna unit 12 and the signal processing circuit 22 to exchange signals. Besides, the manufacturer may enhance the connection between the first signal terminal 13 and the second signal terminal 23 by welding.

In this embodiment, even though the first linking portion 11 is a T-shaped protruding portion and the second linking portion 21 is an H-shaped hole, the invention is not restricted to such an example. The first linking portion 11 may be designed as an H-shaped hole and the second linking portion 21 as a T-shaped protruding portion. In this case, the assembling procedures are the same as above and will not be repeated here.

Figure 6:
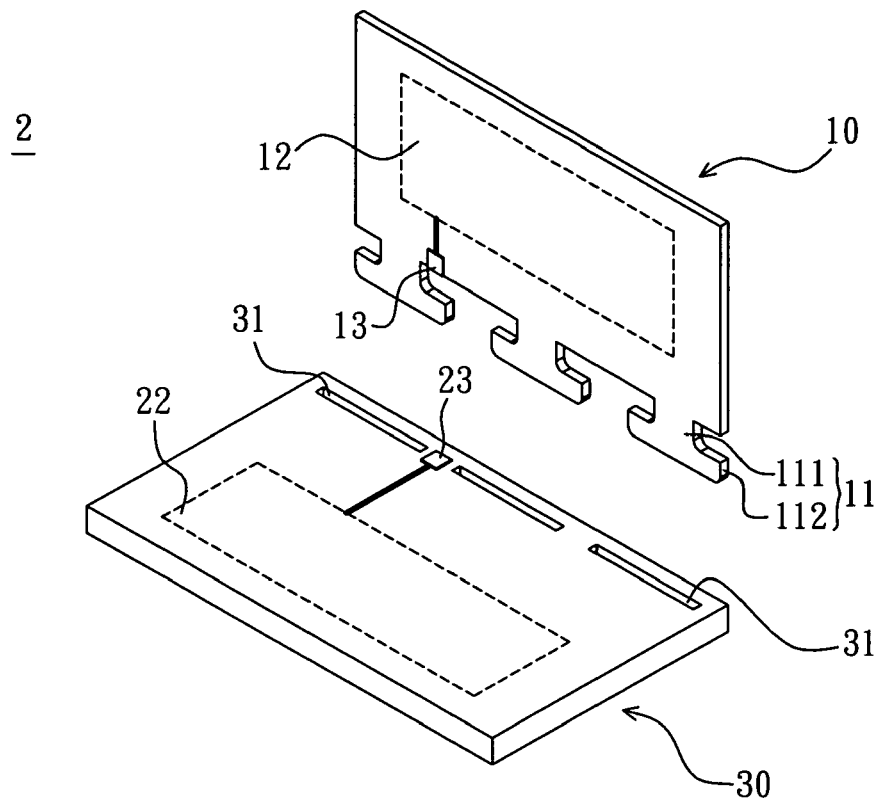
FIG. 6 is a schematic view of a circuit board according to another embodiment of the invention.
Figure 7:
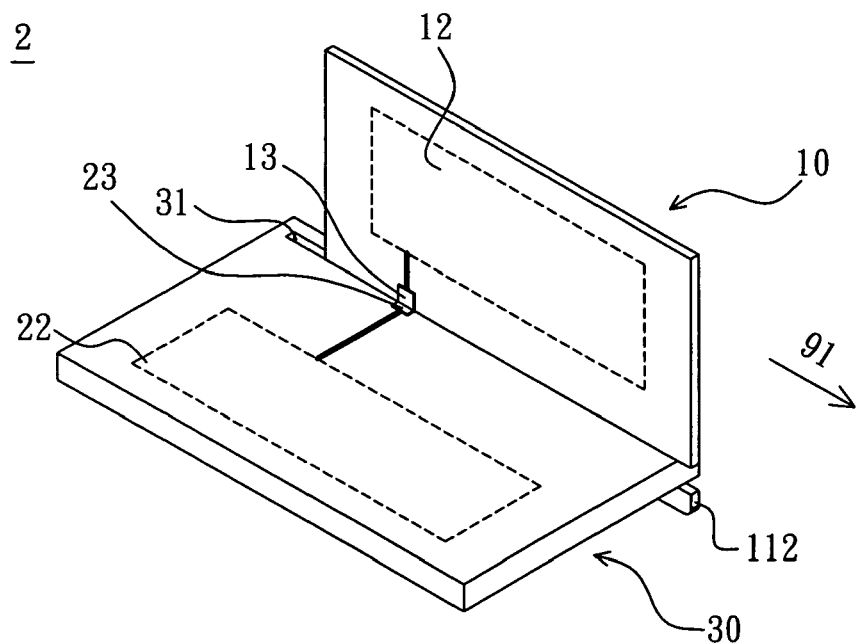
FIG. 7 is a schematic view showing the assembled circuit board according to another embodiment of the invention.

FIGS. 6 and 7 show schematic views of the circuit board according to another embodiment. Elements the same as those shown in FIG. 1 are labeled by the same references and will not be further described hereinafter.

The difference between the circuit board 2 in this embodiment and the circuit board 1 in the previous embodiment as shown in FIG. 1 is that the second linking portion 31 of the main substrate 30 is a rectangular hole. To assemble the antenna substrate 10 and the main substrate 30, the first linking portion 11 of the antenna substrate 10 is inserted into the second linking portion 31 of the main substrate 30. Afterwards, the antenna substrate 10 is displaced along a first direction 91 with respect to the main substrate 30. In this way, the first linking portion 11 and the second linking portion 31 are engaged with one another (FIG. 7).

Figure 8:
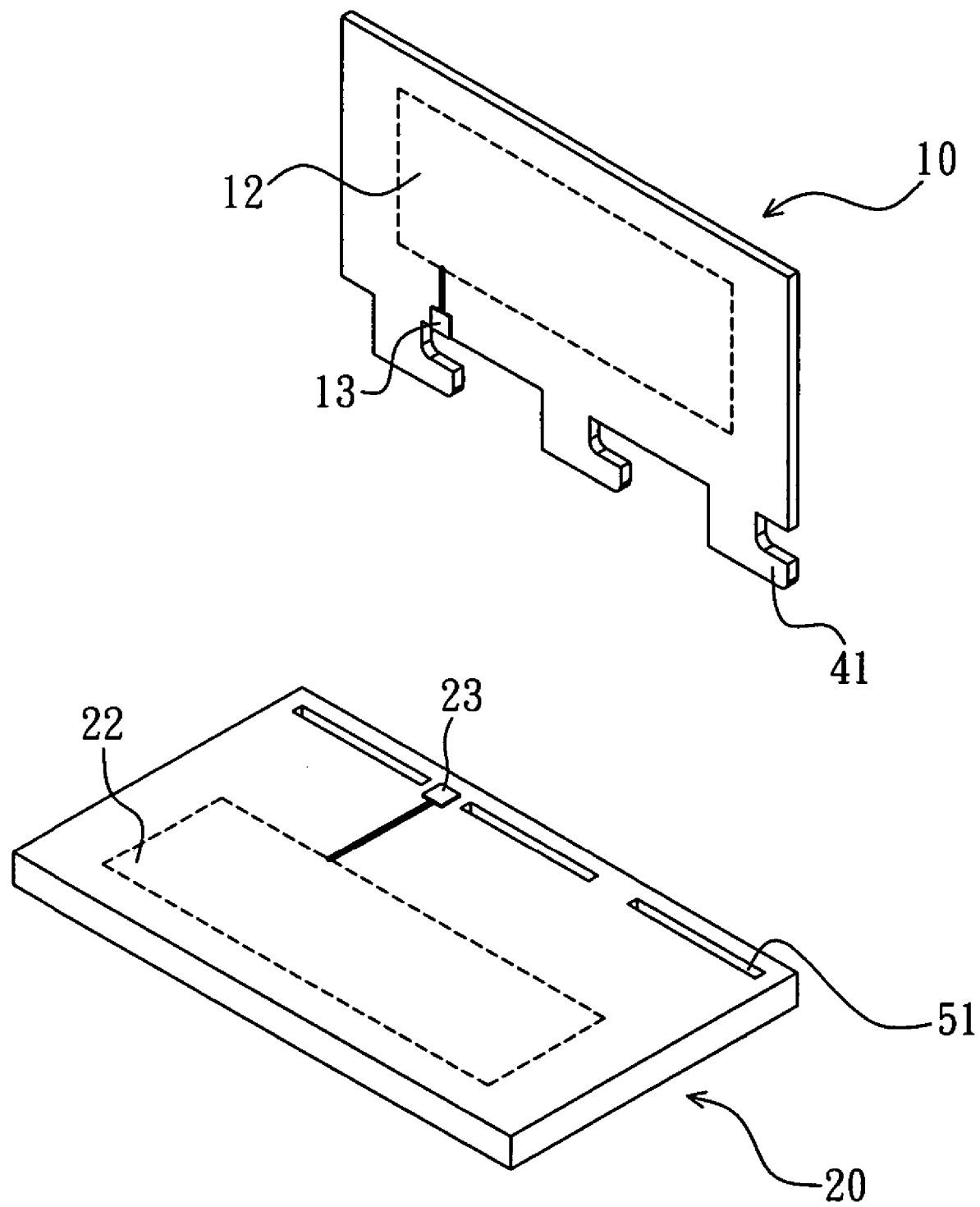
FIG. 8 is a schematic view of a circuit board according to still another embodiment of the invention.

To be noted, the shapes and dimensions of the first linking portion 11 of the antenna substrate 10 and the second linking portion 31 of the main substrate 30 are not limited to the embodiments disclosed above. They can be like the first linking portion 41 and the second linking portion 51 shown in FIG. 8. The first linking portion 41 is an L-shaped hook, and the second linking portion 51 is a rectangular hole. When the first linking portion 41 and the second linking portion 51 are connected, the hook goes through and is engaged with the hole for assembling the antenna substrate 10 and the main substrate 20.

Figure 9:
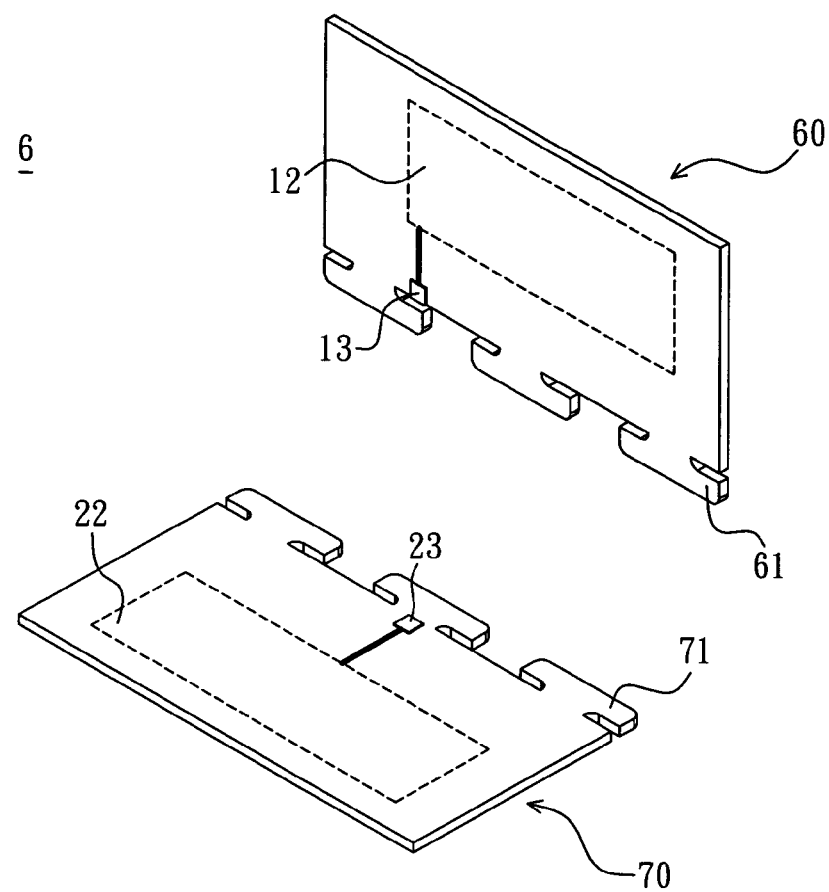
FIG. 9 is a schematic view of a circuit board according to yet another embodiment of the invention.
Figure 10:
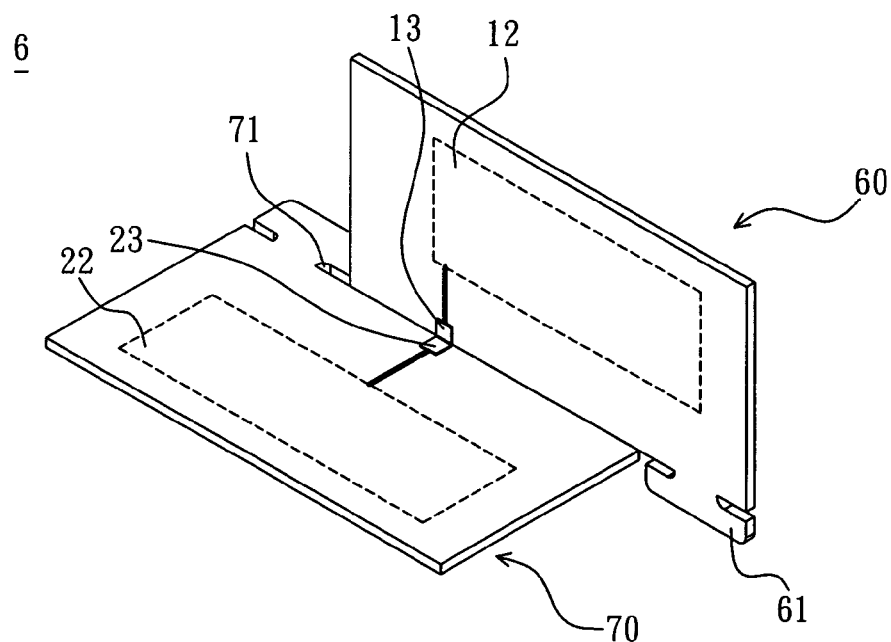
FIG. 10 is a schematic view showing the assembled circuit board according to yet another embodiment of the invention.

FIGS. 9 and 10 show schematic views of the circuit board in yet another embodiment. Elements the same as those shown in FIG. 1 are labeled by the same references and will not be further described hereinafter.

The difference between the circuit board 6 in this embodiment and the circuit board 1 in the previous embodiment as shown FIG. 1 is that the first linking portion 61 of the antenna substrate 60 and the second linking portion 71 of the main substrate 70 are T-shaped protruding portions or L-shaped hooks. To assemble the antenna substrate 60 and the main substrate 70, the manufacturer only needs to fix the two protruding parts (or hooks).

In summary, the circuit board of the invention has independent antenna substrate and main substrate. With the connection of the first linking portion and the second linking portion, the antenna substrate and the main substrate are assembled in a substantially vertical configuration. Therefore, when the antenna needs to be modified or replaced, the manufacturer only needs to separate the antenna substrate from the main substrate, and then assembles a desired antenna substrate with the main substrate. In this case, the antenna design can be readily modified, and the designs for the antenna substrate and the main substrate become more flexible. Moreover, the antenna layout is not directly disposed on the main substrate. Therefore, the area occupied by the antenna layout is largely reduced, which can efficiently minimize the product volume. In addition, since the antenna substrate and the main substrate are substantially perpendicular to each other, the height of the antenna can be increased to avoid interference with other electronic devices.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A circuit board, comprising:
   an antenna substrate having at least one first linking portion, which is a protruding portion with a neck part and an end part; and
   a main substrate having at least one second linking portion, which is an H-shaped hole, wherein the protruding portion is engaged with the hole when the first linking portion connects to the second linking portion so that the antenna substrate and the main substrate are assembled, and the antenna substrate is substantially perpendicular to the main substrate.

2. The circuit board of claim 1, wherein the protruding portion is a T-shaped protruding portion.

3. The circuit board of claim 1, wherein the height of the neck part is substantially equal to the thickness of the main substrate.

4. The circuit board of claim 1, wherein the protruding portion is an L-shaped hook.

5. The circuit board of claim 4, wherein the hook goes through the hole and then engages with the hole so as to connect the first linking portion to the second linking portion.

6. The circuit board of claim 1, wherein the antenna substrate has at least one first signal terminal, the main substrate has at least one second signal terminal, and the first signal terminal is electrically coupled to the second signal terminal when the antenna substrate and the main substrate are assembled.

7. The circuit board of claim 1, wherein the antenna substrate has an antenna unit.

8. The circuit board of claim 1, further comprising a fixing element for fastening the antenna substrate on the main substrate.

9. The circuit board of claim 8, wherein the fixing element is disposed adjacent to the antenna substrate and is fixed on the main substrate.

10. A circuit board, comprising:
    an antenna substrate having at least one first linking portion, which is an H-shaped hole; and
    a main substrate having at least one second linking portion, which is a protruding portion with a neck part and an end part, wherein when the first linking portion connects to the second linking portion, the protruding portion is engaged with the hole, so that the antenna substrate and the main substrate are assembled, and the antenna substrate is substantially perpendicular to the main substrate.

11. The circuit board of claim 10, wherein the protruding portion is a T-shaped protruding portion.

12. The circuit board of claim 10, wherein the height of the neck part is substantially equal to the thickness of the main substrate.

13. The circuit board of claim 10, wherein the protruding portion is an L-shaped hook.

14. The circuit board of claim 13, wherein the hook goes through the hole and then engages with the hole so as to connect the first linking portion to the second linking portion.

15. The circuit board of claim 10, wherein the antenna substrate has at least one first signal terminal, the main substrate has at least one second signal terminal, and the first signal terminal is electrically coupled to the second signal terminal when the antenna substrate and the main substrate are assembled.

16. The circuit board of claim 10, wherein the antenna substrate has an antenna unit.

17. The circuit board of claim 10, further comprising a fixing element for fastening the antenna substrate on the main substrate.

18. The circuit board of claim 17, wherein the fixing element is disposed adjacent to the antenna substrate and is fixed on the main substrate.

* * * * *